(12) United States Patent
Fan et al.

(10) Patent No.: US 6,294,100 B1
(45) Date of Patent: Sep. 25, 2001

(54) EXPOSED DIE LEADLESS PLASTIC CHIP CARRIER

(75) Inventors: Nelson Fan, Sham Tseng; Neil McLellan, Branksom, both of (HK)

(73) Assignee: Asat LTD, Tsuen Wan (HK)

( * ) Notice: Subject to any disclaimer, the term of this patent is extended or adjusted under 35 U.S.C. 154(b) by 0 days.

(21) Appl. No.: 09/454,794

(22) Filed: Dec. 3, 1999

Related U.S. Application Data

(63) Continuation-in-part of application No. 09/288,352, filed on Apr. 8, 1999, which is a continuation-in-part of application No. 09/095,803, filed on Jun. 10, 1998.

(51) Int. Cl.[7] .................................................. C23F 1/00
(52) U.S. Cl. ........................ 216/14; 216/20; 257/678; 257/690; 438/106; 438/745; 438/754
(58) Field of Search ................................. 216/14, 20, 33, 216/37, 52; 438/106, 110, 112, 118, 127, 745, 754; 257/678, 684, 687, 690

(56) References Cited

U.S. PATENT DOCUMENTS

| | | | |
|---|---|---|---|
| 4,530,152 | 7/1985 | Roche et al. | 29/588 |
| 4,685,998 * | 8/1987 | Quinn et al. | 216/14 X |
| 5,976,912 | 11/1999 | Fukutomi et al. | 438/110 |
| 6,001,671 | 12/1999 | Fjelstad | 438/112 |

FOREIGN PATENT DOCUMENTS 59-208756    11/1984 (JP).

* cited by examiner

*Primary Examiner*—William A. Powell
(74) *Attorney, Agent, or Firm*—Keating & Bennett, LLP

(57) ABSTRACT

A leadless integrated circuit package, comprising an exposed semiconductor die and contact pads embedded in an over mold, and wires interconnecting the semiconductor die and contact pads. The leadless integrated circuit package is fabricated by etching a leadframe strip to define a plurality of contact pads; attaching an adhesive film to a bottom surface of the leadframe strip; mounting a semiconductor die to the adhesive film intermediate respective pairs of the contact pads; wire bonding the semiconductor die to the respective pairs of contact pads; encapsulating a top surface of the leadframe strip in a molding material; removing the adhesive film from the bottom surface of the leadframe strip for exposing the contact pads and the semiconductor die; solder plating the exposed bottom surface, and singulating the leadless integrated circuit package from the leadframe strip, whereby the adhesive film holds the semiconductor die in place prior to the encapsulating step, and prevents the molding material from contacting the exposed contact pads.

11 Claims, 3 Drawing Sheets

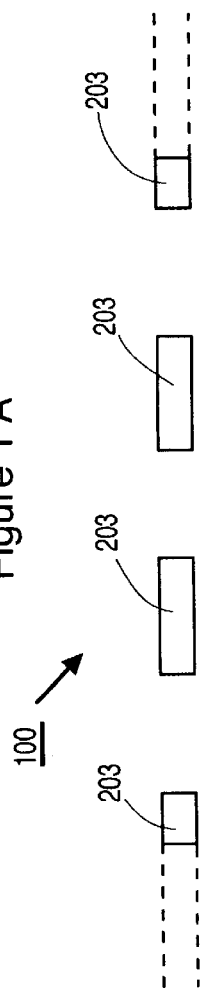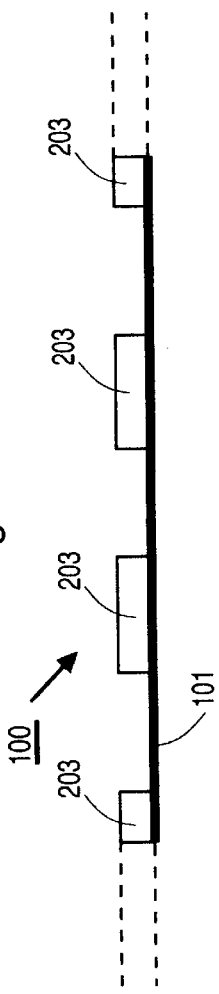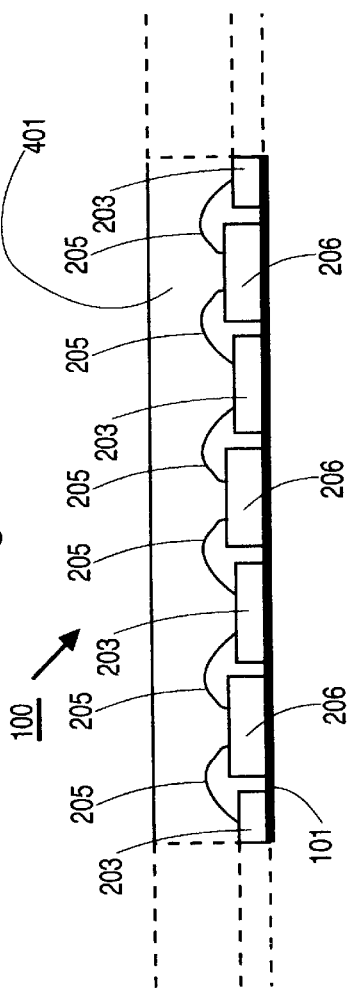

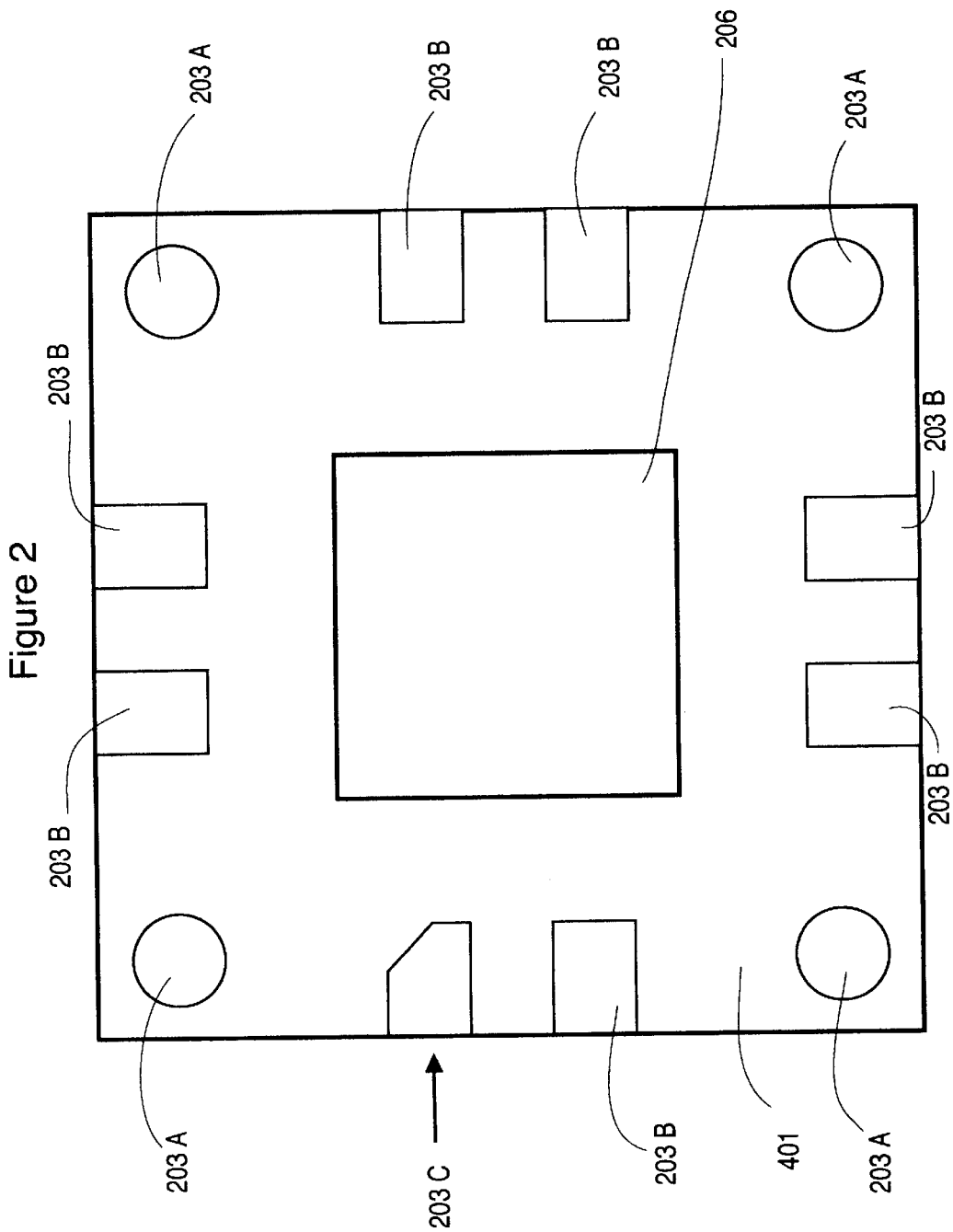

EXPOSED DIE LEADLESS PLASTIC CHIP CARRIER

CROSS-REFERENCE TO RELATED APPLICATION

This is a continuation-in-part of U.S. patent application Ser. No. 09/288,352, filed Apr. 8, 1999, which is a continuation-in-part of U.S. patent application Ser. No. 09/095,803, filed Jun. 10, 1998.

FIELD OF THE INVENTION

This invention relates in general to integrated circuit packaging, and more specifically to an improved process for fabricating a leadless plastic chip carrier which does not require a die attach pad.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die paddle is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' co-pending patent application Ser. No. 09/095,803, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern formed by fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to subsequently filed U.S. patent application Ser. No. 09/288,352, an etch back process is provided for the improved manufacture of Applicants' LPCC IC package. The leadframe strip is first subjected to a partial etch on one or both of the top and bottom surfaces in order to create a pattern of contact leads (pads) and a die attach pad (paddle). After wire bonding the contacts to a singulated semiconductor die, followed by overmolding and curing of the mold, the leadframe strip is exposed to a second full etch immersion for exposing the contact pads in an array pattern (i.e. multi-row) or perimeter pattern (i.e. single row), as well as the die attach pad. In the case of a package with multi-row I/O leads, this etch back step eliminates the requirement for two additional saw singulation operations (i.e. to sever the inner leads from the outer leads), and in both the single-row and multi-row configurations, the etch back step eliminates post mold processing steps (e.g. mold deflashing) and ensures superior device yield over the processing technique set forth in Applicants' prior application No. 09/095,803. Additionally, using this technique allows for higher I/O pad density and also allows for pad standoff from the package bottom which reduces stress in the solder joint during PCB temp cycling.

SUMMARY OF THE INVENTION

According to the present invention, an Exposed Die Leadless Plastic Chip Carrier (EDLPCC) is fabricated utilizing an improved method, whereby no die attach pad is required, in contrast with Applicants' prior LPCC fabrication processes. This results in a low package profile, extremely small IC package assembly, availability of corner areas of the package for additional input/output (I/O), and optional soldering of the exposed die to a circuit mother board for enhanced thermal performance.

Packages with no die pad are known in the prior art. However, such prior art IC packages use non-conductive epoxy applied to the inner leads of the package in order to attach the semiconductor die. This process contributes to the height of the package, increases signal inductance, and increases fabrication costs over other prior art IC packages. Because such devices are a form of SOIC-type package (Small Out Line Integrated Circuit) with leads that project downwardly out of the package into feet (i.e. not a pad array package), there is no exposed die. The die must be placed on top of the leads, which have mold compound under them, and the leads stick out of the side of the package and then bend downwardly. Such devices also offer much lower I/O density than the EDLPCC of the present invention.

BRIEF DESCRIPTION OF THE DRAWINGS

A preferred embodiment of the present invention is described herein below with reference to the drawings in which:

FIG. 2 is a bottom plan view of the EDLPCC according to the present invention.

DETAILED DESCRIPTION OF THE PREFERRED EMBODIMENT

Figure 1:
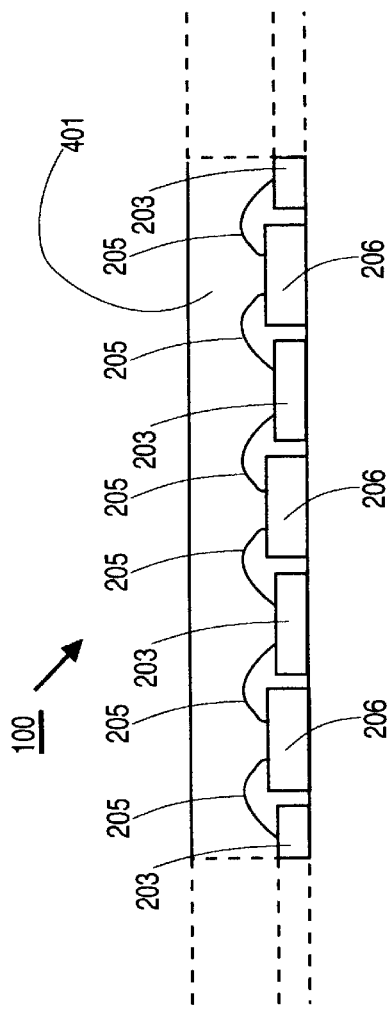
FIGS. 1A–1E show processing steps for manufacturing an Exposed Die Leadless Plastic Chip Carrier (EDLPCC) according to the preferred embodiment.
Figure 1:
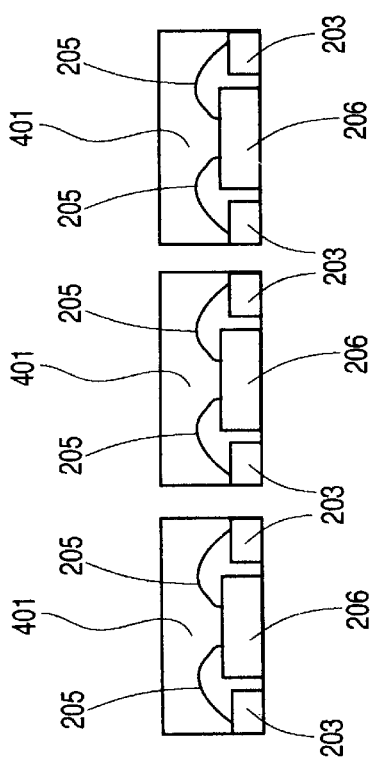

FIGS. 1A–1E show the basic steps in fabricating an Exposed Die Leadless Plastic Chip Carrier (EDLPCC) according to the present invention. The description of Applicant's process as set forth herein is general in nature, to facilitate ease of understanding. The EDLPCC is manufactured similarly to Applicant's LPCC, using a leadframe array format. Consequently, additional details of some of the actual processing steps which are common to Applicant's prior LPCC processes are not set forth herein but would be well known to persons of ordinary skill in the art, having regard to Applicant's co-pending application Ser. Nos. 09/095,803 and 09/288,352, the contents of which, as indicated above, are incorporated herein by reference. Wherever possible, the same reference numerals have been used in this specification to denote identical features described in Applicant's earlier applications.

With reference to FIG. 1A, a cross section view is provided of a copper panel substrate which has been subjected to a wet etch process in order to create a leadframe strip 100 having contact pads 203. In contrast with Applicant's prior art LPCC process, the etching of the leadframe strip 100 according to the present invention does not result in any die attach pad. The strip 100 is then plated with silver (Ag) or nickel/paladium (Ni/Pd) to facilitate wire bonding, as discussed in greater detail below with reference to FIG. 1C. As discussed in greater detail in Applicant's co-pending application Ser. No. 09/095,803, the leadframe strip 100 is divided into a plurality of sections, each of which incorporates a plurality of leadframe units (e.g. 3×3 array, 5×5 array, etc.) Only one such 3×3 array is shown in the elevation view of FIG. 1A, portions of adjacent units being shown in stippled lines.

In order to facilitate die attachment in the absence of a die attach pad, an organic film (e.g. high temperature polyimide or other high temperature stable organic compound) is applied to the back surface of the leadframe strip 100 (FIG 1B). The organic film is precoated with a tacky adhesive, resulting in an organic film tape 101, which holds the die in place during processing and also stops mold flash from accumulating on the leads, as discussed in greater detail below.

Following the strip lamination step of FIG. 1B, a singulated semiconductor die 206 is mounted in the center of the package body using a typical die attach machine, but with no requirement for epoxy to be dispensed (FIG. 1C), as is required in prior art fabrication processes. The die 206 is held in place by the tacky film 101 laminated to the back surface of leadframe 100.

Following die attach to the film 101, gold wires 205 are bonded between the semiconductor die 206 and peripheral leads or contacts 203. The leadframe 100 is then molded using a modified mold with the bottom cavity being a flat plate, and subsequently cured, as discussed in Applicant's application Ser. No. 09/095,803. Next, the tacky film 101 is mechanically removed (i.e. peeled back). The leadframe 100, after the foregoing steps, is shown in FIG. 1D, which includes overmold 401 of cured plastic or epoxy.

During the mold step (FIG. 1C), the film laminate 101 not only holds the die 206 in place during processing, but also inhibits the flow of mold compound resin which may otherwise result in yield-reducing mold flash.

After solder plating, the molded body of FIG. 1D is saw singulated to produce the finished IC package (FIG. 1E).

Because the exposed silicon surface of the die 206 is not solderable, the back of the exposed surface of the die may, optionally, be vapor deposited with a layer of CrNiAu, before singulation, to facilitate soldering of the finished part to a printed circuit mother board for improving thermal performance. However, any other suitable vapor deposited material layers may be chosen for the purpose of soldering the back of the die 206.

Turning to FIG. 2, an EDLPCC package is shown according to the present invention, wherein the contacts 203 may either be in the form of round corner pads 203A which are surrounded by plastic 401, or rectangular pads 203B which extend to the edges of the package. Also, one of the rectangular contact pads 203C may be provided with a notch for "pin one" indication.

It will be appreciated that, although a particular embodiment of the invention has been described and illustrated in detail, various changes and modifications may be made. All such changes and modifications may be made without departing from the sphere and scope of the invention as defined by the claims appended hereto.

What is claimed is:

1. A process for fabricating a leadless integrated circuit package, comprising the steps of:

etching a leadframe strip to define a plurality of contact pads;

attaching an adhesive film to a bottom surface of said leadframe strip;

mounting a semiconductor die to said adhesive film intermediate respective pairs of said contact pads;

wire bonding said semiconductor die to said respective pairs of contact pads;

encapsulating a top surface of said leadframe strip in a molding material;

removing said adhesive film from said bottom surface of said leadframe strip for exposing said contact pads and said semiconductor die;

solder plating the exposed bottom surface of said leadframe strip; and singulating said leadless integrated circuit package from said leadframe strip, whereby said adhesive film holds said semiconductor die in place prior to said step of encapsulating, and prevents said molding material from contacting said exposed contact pads.

2. The process of claim 1, wherein said step of attaching the adhesive film to the bottom surface of said leadframe strip further comprises the steps of applying to said bottom surface a high temperature stable organic film which has been pre-coated with a tacky adhesive.

3. The process of claim 2, wherein said organic film is high temperature stable polyimide.

4. The process of claim 1, 2, or 3, further comprising the step of vapor depositing a layer of solderable material to the exposed semiconductor die.

5. The process of claim 4, wherein said solderable material further comprises CrNiAu.

6. A leadless integrated circuit package, comprising an exposed semiconductor die and contact pads embedded in an over mold, and wires interconnecting said semiconductor die and said contact pads.

7. The leadless integrated circuit package of claim 6, wherein at least one of said contact pads is circular in shape and inset relative to an outer edge of said package.

8. The leadless integrated circuit package of claim 6, wherein at least one of said contact pads is rectangular and extends to an outer edge of said package.

9. The leadless integrated circuit package of claim 8, wherein said at least one of said contact pads is provided with a notch for "pin one" indication.

10. The leadless integrated circuit package of claim 6, further comprising a layer of solderable material vapor deposited to the exposed semiconductor die.

11. The leadless integrated circuit package of claim 10, wherein said solderable material further comprises respective layers of chromium, nickel and gold.

* * * * *